United States Patent
Mueller

(10) Patent No.: US 12,326,667 B2
(45) Date of Patent: Jun. 10, 2025

(54) COMBINATION OF INLINE METROLOGY AND ON TOOL METROLOGY FOR ADVANCED PACKAGING

(71) Applicant: Applied Materials, Inc., Santa Clara, CA (US)

(72) Inventor: Ulrich Mueller, Berkeley, CA (US)

(73) Assignee: Applied Materials, Inc., Santa Clara, CA (US)

( * ) Notice: Subject to any disclaimer, the term of this patent is extended or adjusted under 35 U.S.C. 154(b) by 140 days.

(21) Appl. No.: 18/081,751

(22) Filed: Dec. 15, 2022

(65) Prior Publication Data

US 2024/0201605 A1 Jun. 20, 2024

(51) Int. Cl.
*G03F 9/00* (2006.01)

(52) U.S. Cl.
CPC .......... *G03F 9/7023* (2013.01); *G03F 9/7069* (2013.01); *G03F 9/7084* (2013.01)

(58) Field of Classification Search
None
See application file for complete search history.

(56) References Cited

U.S. PATENT DOCUMENTS

| | | | | |
|---|---|---|---|---|
| 4,770,590 | A * | 9/1988 | Hugues | H01L 21/681 901/17 |
| 10,678,150 | B1 | 6/2020 | Hollerbach et al. | |
| 10,809,637 | B1 | 10/2020 | Coskun | |
| 12,124,178 | B2 * | 10/2024 | Lan | G03F 1/82 |
| 2009/0086207 | A1 | 4/2009 | Dohse | |
| 2018/0329310 | A1 * | 11/2018 | Coskun | G03F 7/70633 |
| 2018/0356348 | A1 | 12/2018 | Tsai et al. | |
| 2018/0373161 | A1 | 12/2018 | Coskun et al. | |
| 2019/0019769 | A1 | 1/2019 | Coskun et al. | |

(Continued)

FOREIGN PATENT DOCUMENTS

| | | | | |
|---|---|---|---|---|
| WO | WO-2020242702 | A1 * | 12/2020 | G03F 7/70291 |
| WO | 2022/119796 | A1 | 6/2022 | |

OTHER PUBLICATIONS

International Search Report and Written Opinion for International Application No. PCT/US2023/078375 dated Feb. 27, 2024.

*Primary Examiner* — Jonathan M Hansen
*Assistant Examiner* — Jarreas Underwood
(74) *Attorney, Agent, or Firm* — Patterson + Sheridan, LLP

(57) ABSTRACT

Aspects of the present disclosure generally relate to a digital lithography system and methods for alignment resolution with the digital lithography system. The digital lithography system includes a metrology system configured to improve overlay alignment for different layers of the lithography process. The metrology system includes an inline metrology system (IMS) in combination with an on tool metrology system (OTM), which enable substrate overlay alignment and die placement correction. The inline metrology system may be positioned on an inline metrology tool and the on tool metrology system is positioned on a digital lithography tool. The inline metrology system facilitates measurement of high-throughput measurement inline metrology data for marks such as die marks and global alignment marks for verification of process stability and die placement data for digital data correction. This inline metrology data can be compared with a design file to determine offsets for the digital data correction.

17 Claims, 8 Drawing Sheets

(56) References Cited

U.S. PATENT DOCUMENTS

| | | |
|---|---|---|
| 2019/0064683 A1 | 2/2019 | Coskun et al. |
| 2020/0103772 A1 | 4/2020 | Goorden et al. |
| 2020/0393373 A1 | 12/2020 | Immer et al. |
| 2021/0341849 A1 | 11/2021 | Hollerbach et al. |
| 2022/0163423 A1 | 5/2022 | Sun et al. |

* cited by examiner

COMBINATION OF INLINE METROLOGY AND ON TOOL METROLOGY FOR ADVANCED PACKAGING

TECHNICAL FIELD

Aspects of the present disclosure generally relate to a digital lithography system and methods for alignment resolution with the digital lithography system.

BACKGROUND

Maskless lithography is used in the manufacturing of semiconductor devices, such as for back-end processing of semiconductor devices, and display devices, such as liquid crystal displays (LCDs). It is desirable to align subsequent layers of a mask pattern into a photoresist disposed over a substrate. It is also desirable to position dice on the substrate accurately. Accordingly, what is needed in the art is an improved system and method for improving overlay accuracy and digital correction of digital lithography processes.

SUMMARY

Aspects of the present disclosure generally relate to a digital lithography system and methods for alignment resolution with the digital lithography system.

In one aspect, a method for processing a substrate. The method includes loading a substrate onto a stage of an inline metrology tool. The inline metrology tool includes at least one scanning device. The substrate includes one or more packages including one or more die having die marks formed on the one or more die and one or more global alignment marks formed on the substrate. The method further includes scanning the substrate with the at least one scanning device to obtain a first set of coordinate data. The first set of coordinate data includes an actual location of the one or more global alignment marks and an actual location of the die marks. The method further includes establishing general location information of the substrate based on the actual location of the global alignment marks. The method further includes determining the actual location of the die marks relative to the general location information. The method further includes comparing the actual location of the die marks relative to the general location information with a design location of the die marks relative to the general location information to determine a correction factor. The method further includes loading the substrate onto a stage of a maskless lithography tool including at least one scanning device and at least one image projection system. The method further includes scanning the substrate with the at least one scanning device of the maskless lithography tool to establish the general location information of the substrate based on the actual location of the die marks. The method further includes patterning subsequent layers onto the substrate using a digital correction mask and the at least one image projection system, wherein the digital correction mask is based, at least in part on the correction factor.

Implementations may include one or more of the following. The one or more global alignment marks have a width in a range from about 50 microns to about 1000 microns. The die marks have a width of 50 microns or less. Establishing the general location information of the substrate includes establishing a general coordinate system of the substrate using the actual location of the one or more global alignment marks. Comparing the actual location of the die marks relative to the general location information with the design location of the die marks relative to the general location information to determine the correction factor includes comparing the actual location of the die marks relative to the general coordinate system to determine shifting and rotation of the one or more die relative to the general coordinate system. The first set of coordinate data further includes a Z-height of the substrate. The first set of coordinate data further includes the actual location of one or more mini-marks formed on the substrate, wherein the one or more mini-marks are distinguishable from the one or more global alignment marks in size, shape, or both size and shape. At least a portion of the one or more mini-marks is positioned between adjacent packages of the one or more packages. Scanning the substrate with the at least one scanning device to obtain the first set of coordinate data includes capturing images of the one or more global alignment marks and the die marks. Capturing images of the one or more global alignment marks and the die marks includes moving a lens of the at least one scanning device vertically to adjust a focus of the lens on the substrate and providing illumination to the substrate via one or more LEDs and an illuminator, wherein the images are captured at different focuses by moving the lens vertically.

In another aspect, a method for processing a substrate is provided. The method includes loading a substrate onto a stage of an inline metrology system. The substrate includes one or more packages including one or more die having die marks formed on the one or more die, global alignment marks formed on the substrate, and one or more calibration marks formed on the substrate. The method further includes capturing images of the global alignment marks using at least one scanning device associated with the inline metrology system to establish a metrology coordinate system of the substrate. The method further includes capturing images of the die marks using the at least one scanning device. The method further includes determining a position of the die marks relative to the metrology coordinate system established by the global alignment marks. The method further includes comparing the position of the global alignment marks and the die marks with a design file to obtain correction data. The method further includes transferring the substrate onto a stage of a digital lithography system. The method further includes determining a position of the global alignment marks using at least one scanning device associated with the digital lithography system to determine positioning of the substrate. The method further includes patterning subsequent layers onto the substrate using a digital correction mask and at least one image projection system, wherein the digital correction mask is based, at least in part on the correction data.

Implementations may include one or more of the following. The global alignment marks have a width in a range from about 50 microns to about 1000 microns. The die marks have a width of 50 microns or less. Patterning subsequent layers includes forming connections between adjacent die of the one or more die. Capturing images of the global alignment marks and capturing images of the die marks includes moving a lens of the at least one scanning device vertically to adjust a focus of the lens on the substrate and providing illumination to the substrate via one or more LEDs and an illuminator, wherein the images are captured at different focuses by moving the lens vertically. The method further includes capturing images of one or more mini-marks formed on the substrate using the at least one scanning device, wherein the one or more mini-marks are distinguishable from the global alignment marks in size, shape, or both size and shape. At least a portion of the one or more mini-marks is positioned between adjacent packages of the one or more packages.

In yet another aspect, an inline metrology system is provided. The inline metrology system includes a slab, a moveable stage disposable over the slab, the moveable stage configured to support a substrate, a support coupled to the slab having an opening to allow the moveable stage to pass thereunder, and a plurality of metrology systems coupled to the support. The one or more metrology systems each include a microscope body, a lens coupled to the microscope body, a focusing stage disposed between the microscope body and the lens, wherein the focusing stage is configured to move the lens to adjust a focus of the lens, a camera coupled to the microscope body, a first LED, a second LED, and a third LED coupled to the microscope body, wherein the LEDs deliver light to the microscope body, and an illuminator disposed below the lens.

Implementations may include one or more of the following. The lens is an objective lens. The system further includes a controller, wherein the controller is configured to instruct the focusing stage to move the lens to adjust the focus, wherein the camera captures images at multiple focuses.

In yet another aspect, a non-transitory computer readable medium has stored thereon instructions, which, when executed by a processor, causes the process to perform operations of the above apparatus and/or method.

BRIEF DESCRIPTION OF THE DRAWINGS

So that the manner in which the above-recited features of the present disclosure can be understood in detail, a more particular description of the aspects, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
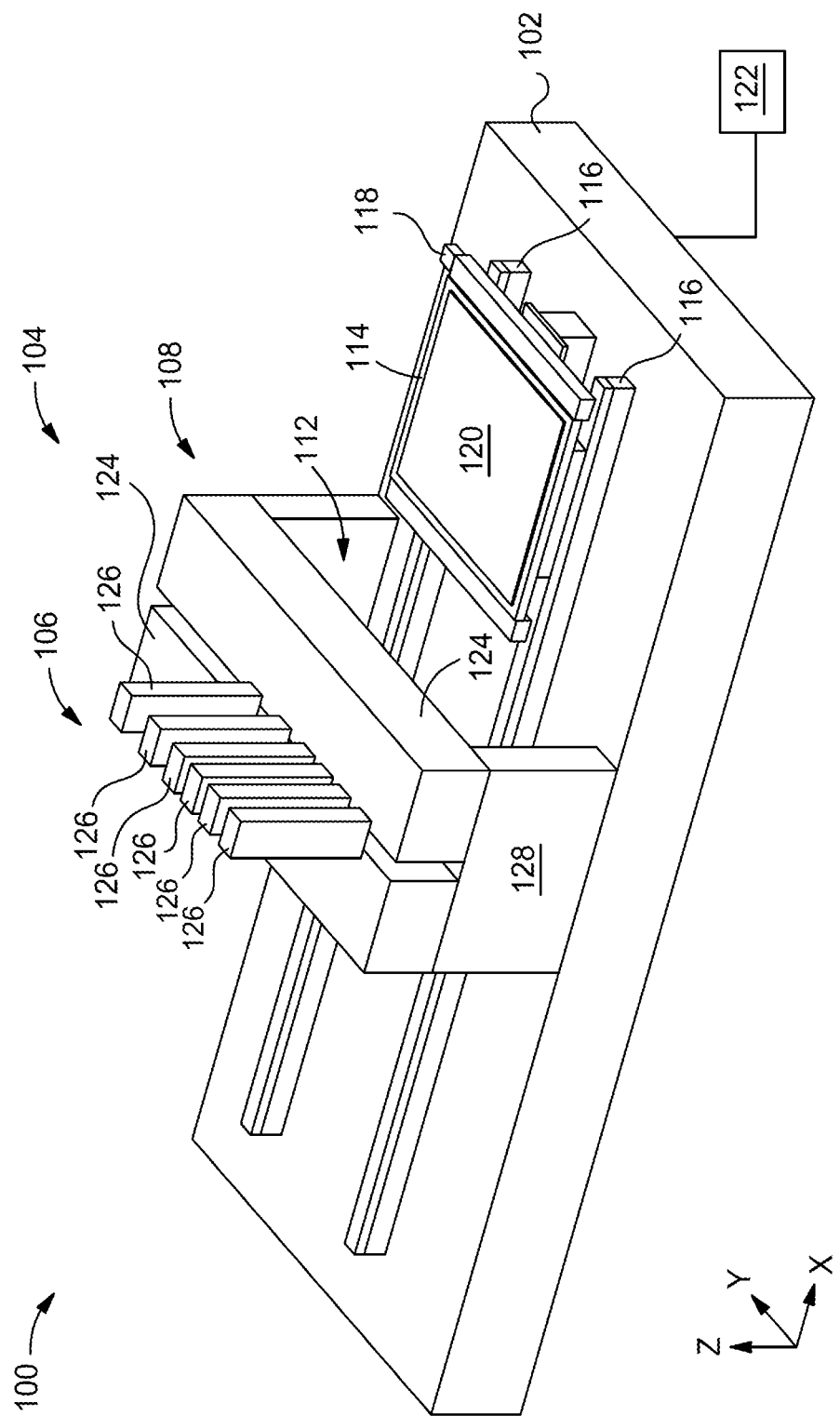
FIG. 1 illustrates a perspective view of an inline metrology system in accordance with at least one implementation of the present disclosure.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Aspects of the present disclosure generally relate to a digital lithography system and methods for alignment resolution with the digital lithography system. The digital lithography system includes a metrology system configured to improve overlay alignment for different layers of the lithography process. The metrology system includes an inline metrology system (IMS) in combination with an on tool metrology system (OTM), which enable substrate overlay alignment and die placement correction. The inline metrology system may be positioned on an inline metrology tool and the on tool metrology system is positioned on a digital lithography tool. The inline metrology system is configured to facilitate measurement of high-throughput measurement inline metrology data for marks such as package marks, die marks, global alignment marks, and other marks for verification of process stability and die placement data for digital data correction. A relationship between the global alignment marks and the actual location of the die marks is determined. This inline metrology data can be compared with a design file to determine offsets for the digital data correction. For example, the actual location of the die marks relative to the global alignment marks is compared to a design location of the die marks relative to the global alignment marks, which is obtained from the design file. The difference between the actual location of the die marks and the design location is used to determine offsets for the digital correction data. After transferring the substrate from the inline metrology tool to the digital lithography tool, the on tool metrology provides alignment of the inline metrology data to the digital lithography projection heads or "eyes" of the digital lithography tool. For example, the on tool metrology determines the location of the global alignment marks to provide alignment of the digital lithography projection heads. The offsets for digital data correction from the inline metrology system can be used to correct the digital mask used for patterning on the digital lithography tool. In addition, global alignment and focusing data from the on tool metrology system can feedback to the inline metrology system to improve future processing. This feedback of global alignment data from the digital lithography tool to the inline metrology system can enable improved metrology capture performance. For example, the feedback data can optimize focusing performance of the inline metrology system when obtaining metrology data from subsequent substrates, which can reduce the time for capturing metrology data from subsequent substrates. Further, the on tool metrology enables measurement of smaller global alignment marks, die marks, and packaging marks, than the alignment system built in to the digital lithography projection heads. Moreover, the OTM to digital lithography projection head calibration enables overlay of inline metrology data to a digital lithography coordinate system, which further improves the accuracy of the patterning process performed on the digital lithography tool.

FIG. 1 illustrates a perspective view of an inline metrology system 100 in accordance with at least one implementation of the present disclosure. The inline metrology system 100 may be used to provide metrology data for advanced package die placement to enable digitally corrected lithography. The inline metrology system 100 may be used in combination with on tool metrology, for example, metrology positioned on a digital lithography tool, to enable substrate overlay alignment and die placement correction for digitally corrected lithography performed on the digital lithography tool. The inline metrology system 100 includes a stage 114 and a metrology apparatus 104. The stage 114 is supported by a pair of tracks 116 disposed on a slab 102. A substrate 120 is supported by the stage 114. The stage 114 moves along the pair of tracks 116 in the X-direction as indicated by the coordinate system shown in FIG. 1. The stage 114 also moves in the Y-direction for processing and/or indexing a substrate 120. The stage 114 is capable of independent operation and can scan the substrate 120 in one direction and step in the other direction. An encoder 118 is coupled to the stage 114 in order to provide information of the location of the stage 114 to a controller 122.

The controller 122 is generally designed to facilitate the control and automation of the metrology and processing techniques described. The controller 122 may be coupled to or in communication with the metrology apparatus 104, the stage 114, and the encoder 118. The metrology apparatus 104 may provide information for example, metrology data, to the controller 122 regarding substrate alignment as described.

The substrate 120 comprises any suitable material, for example, glass, which is used as part of a flat panel display, or semiconductor materials used as part of a semiconductor wafer. The substrate 120 may be any suitable shape, for example, a rectangular panel as shown in FIG. 1 or a circular wafer used in semiconductor manufacturing. The substrate 120 has a film layer to be patterned formed thereon, such as by pattern etching thereof, and a photoresist layer formed on the film layer to be patterned, which is sensitive to electromagnetic radiation, for example UV or deep UV "light". A positive photoresist includes portions of the photoresist, when exposed to radiation, are respectively soluble to a photoresist developer applied to the photoresist after the pattern is written into the photoresist using the electromagnetic radiation. A negative photoresist includes portions of the photoresist, when exposed to radiation, will be respectively insoluble to photoresist developer applied to the photoresist after the pattern is written into the photoresist using the electromagnetic radiation. The chemical composition of the photoresist determines whether the photoresist is a positive photoresist or negative photoresist. After exposure of the photoresist to the electromagnetic radiation, the resist is developed to leave a patterned photoresist on the underlying film layer. Then, using the patterned photoresist, the underlying thin film is pattern etched through the openings in the photoresist to form a portion of the electronic circuitry of the display panel. Additional details about the substrate 120 are discussed with respect to FIGS. 4A-4B.

The metrology apparatus 104 includes a support 108 and a metrology unit 106. The support 108 includes a pair of risers 128, disposed on the slab 102, supporting two or more bridges 124. The pair of risers 128 and bridges 124 form an opening 112 for the pair of tracks 116 and the one or more stages 114 to pass under the metrology unit 106. The metrology unit 106 is supported by the support 108. The metrology unit 106 includes a plurality of metrology systems 126. The plurality of metrology systems 126 are supported by one or more bridges 124. Although FIG. 1 depicts six metrology systems 126, the metrology unit 106 is not limited in how many or where the metrology systems 126 are positioned on the support 108. As such, the metrology systems 126 have a field of view that includes the substrate 120, when the substrate 120 is positioned under the support 108.

Figure 2:
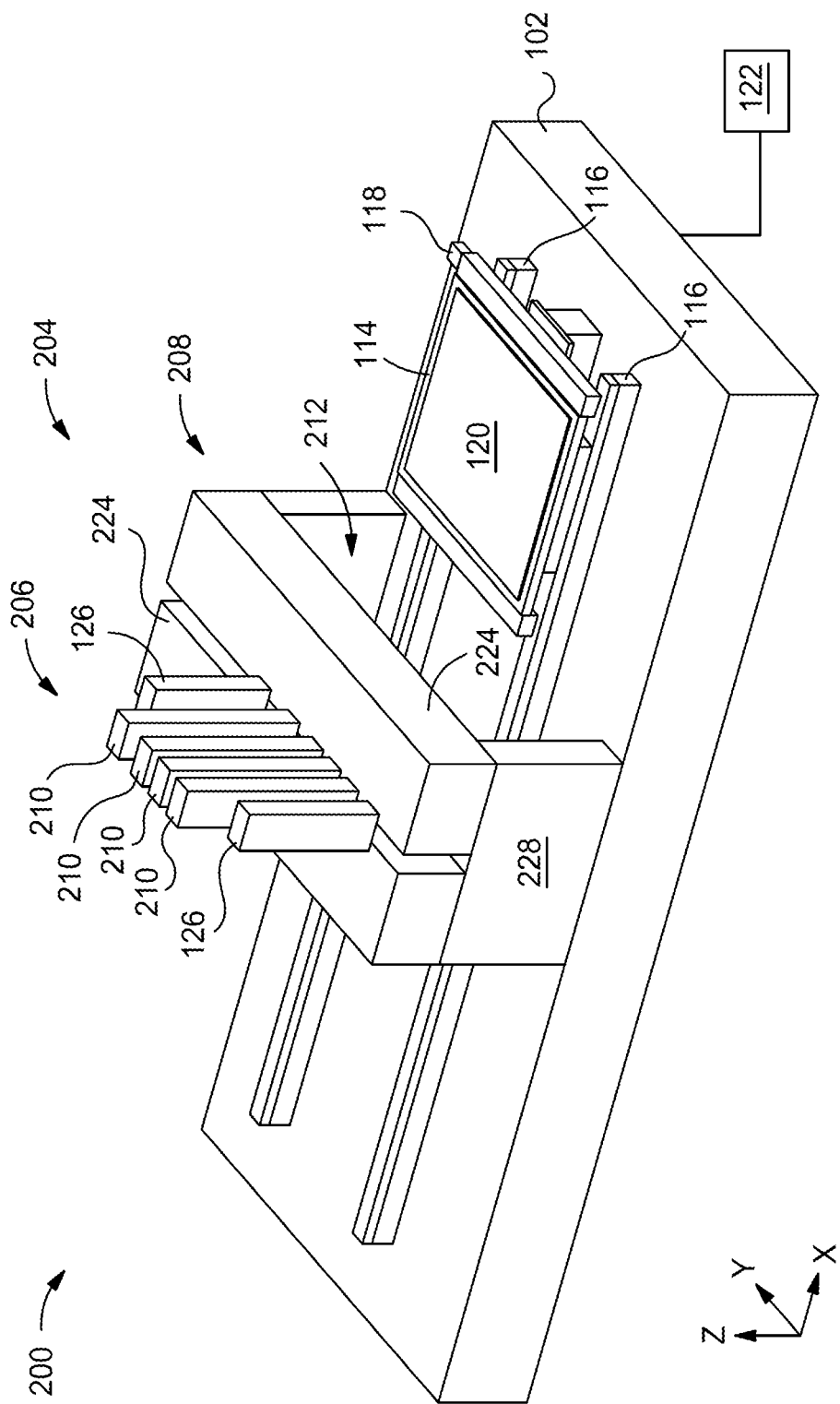
FIG. 2 illustrates a perspective view of a digital lithography system in accordance with at least one implementation of the present disclosure.

FIG. 2 illustrates a perspective view of a digital lithography system 200 in accordance with at least one implementation of the present disclosure. The digital lithography system 200 includes the stage 114 and a processing apparatus 204. The digital lithography system 200 includes on tool metrology that may be used in combination with an inline metrology system, for example, the inline metrology system 100, to enable substrate overlay alignment and die placement correction for digitally corrected lithography performed on the digital lithography system 200. As previously described, the stage 114 is supported by the pair of tracks 116 disposed on the slab 102. The substrate 120 is supported by the stage 114. The stage 114 moves along the pair of tracks 116 in the X-direction as indicated by the coordinate system shown in FIG. 2. The stage 114 also moves in the Y-direction for processing and/or indexing a substrate 120. The stage 114 is capable of independent operation and can scan the substrate 120 in one direction and step in the other direction. The encoder 118 is coupled to the stage 114 in order to provide information of the location of the stage 114 to the controller 122.

The controller 122 is generally designed to facilitate the control and automation of the processing techniques described. The controller 122 may be coupled to or in communication with the processing apparatus 204, the stage 114, and the encoder 118. The processing apparatus 204 and the encoder 118 may provide information to the controller 122 regarding the substrate processing and the substrate aligning. For example, the processing apparatus 204 may provide information to the controller 122 to alert the controller 122 that substrate processing has been completed. A program (or computer instructions), which may be referred to as an imaging program, readable by the controller 122, determines which tasks are performable on a substrate. The program includes a design file and code to monitor and control the processing time and substrate position. The design corresponds to a pattern to be written into the photoresist using the electromagnetic radiation. The controller 122 includes a central processing unit (CPU) configured to process computer-executable instructions, for example, stored in a memory or storage, and to cause the controller to perform implementations of methods described. The memory in the controller 122 may include components configured to run programs and software to perform implementations of the methods described.

To facilitate control of and automation of the processing techniques described, the CPU may be one of any form of general purpose computer processor that can be used in an industrial setting, such as a programmable logic controller (PLC), for controlling various chambers and sub-processors. The memory is coupled to the CPU and the memory is non-transitory and may be one or more of readily available memory such as random access memory (RAM), read only memory (ROM), floppy disk drive, hard disk, or any other form of digital storage, local or remote. Support circuits are coupled to the CPU for supporting the processor in a conventional manner. The layer formation, curing, and other processes are generally stored in the memory, typically as a software routine. The software routine may also be stored and/or executed by a second CPU that is remotely located from the hardware being controlled by the CPU.

The memory may be in the form of computer-readable storage media that contains instructions, that when executed by the CPU, facilitates the operation of an inline metrology system 100 and/or the digital lithography system 200. The instructions in the memory are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein).

In certain embodiments, the program(s) embody machine learning capabilities. Various data features include process parameters such as processing times, temperatures, pressures, voltages, polarities, powers, gas species, precursor flow rates, and the like. Relationships between the features are identified and defined to enable analysis by a machine learning algorithm to ingest data and adapt processes being performed by the UV curing apparatus 165a-165g. The machine learning algorithms may employ supervised learning or unsupervised learning techniques. Examples of machine learning algorithms embodied by the program include, but are not limited to, linear regression, logistic regression, decision tree, state vector machine, neural network, naïve Bayes, k-nearest neighbors, K-Means, random forest, dimensionality reduction algorithms, and gradient boosting algorithms, among others.

Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure. In some embodiments, the controller 190 is an etherCAT controller.

The processing apparatus 204 includes a support 208 and a processing unit 206. The support 208 includes a pair of risers 228, disposed on the slab 102, supporting two or more bridges 224. The pair of risers 228 and bridges 224 form an opening 212 for the pair of tracks 116 and the one or more stages 114 to pass under the processing unit 206. The processing unit 206 is supported by the support 208. The processing unit 206 includes a plurality of image projection systems (IPSs) 210 (also known as "eyes") and one or more of the metrology systems 126. The IPSs 210 are used to print lithographic patterns on the substrate 120. The plurality of IPSs 210 and the metrology systems 126 are supported by the one or more bridges 224. Although FIG. 2 depicts four IPSs 210 and two metrology systems 126, the processing unit 206 is not limited in how the metrology systems 126 and the IPSs 210 are positioned on the support 208. In one example, the number of IPSs 210 is equal to the number of metrology systems 126. In another example, the number of IPSs 210 is less than the number of metrology systems 126. In yet another example, the number of IPSs is more than the number of metrology systems 126. The metrology systems 126 may be positioned as needed relative to the IPSs 210. For example, the metrology system 126 may be positioned between two IPSs 210. The metrology system 126 and the IPSs 210 are positioned on the support 208 to be above the substrate 120. As such, the metrology system 126 and the IPSs have a field of view that includes the substrate 120, when the substrate 120 is positioned under the support 208.

In at least one implementation, the processing unit 206 contains as many as 84 IPSs 210. Each IPS 210 includes a spatial light modulator. The spatial light modulator includes, but is not limited to, microLEDs, OLEDs, digital micromirror devices (DMDs), liquid crystal displays (LCDs), and vertical-cavity surface emitting lasers (VCSELs). The components of each of the IPSs 210 may vary depending on the spatial light modulator being used.

Figure 3:
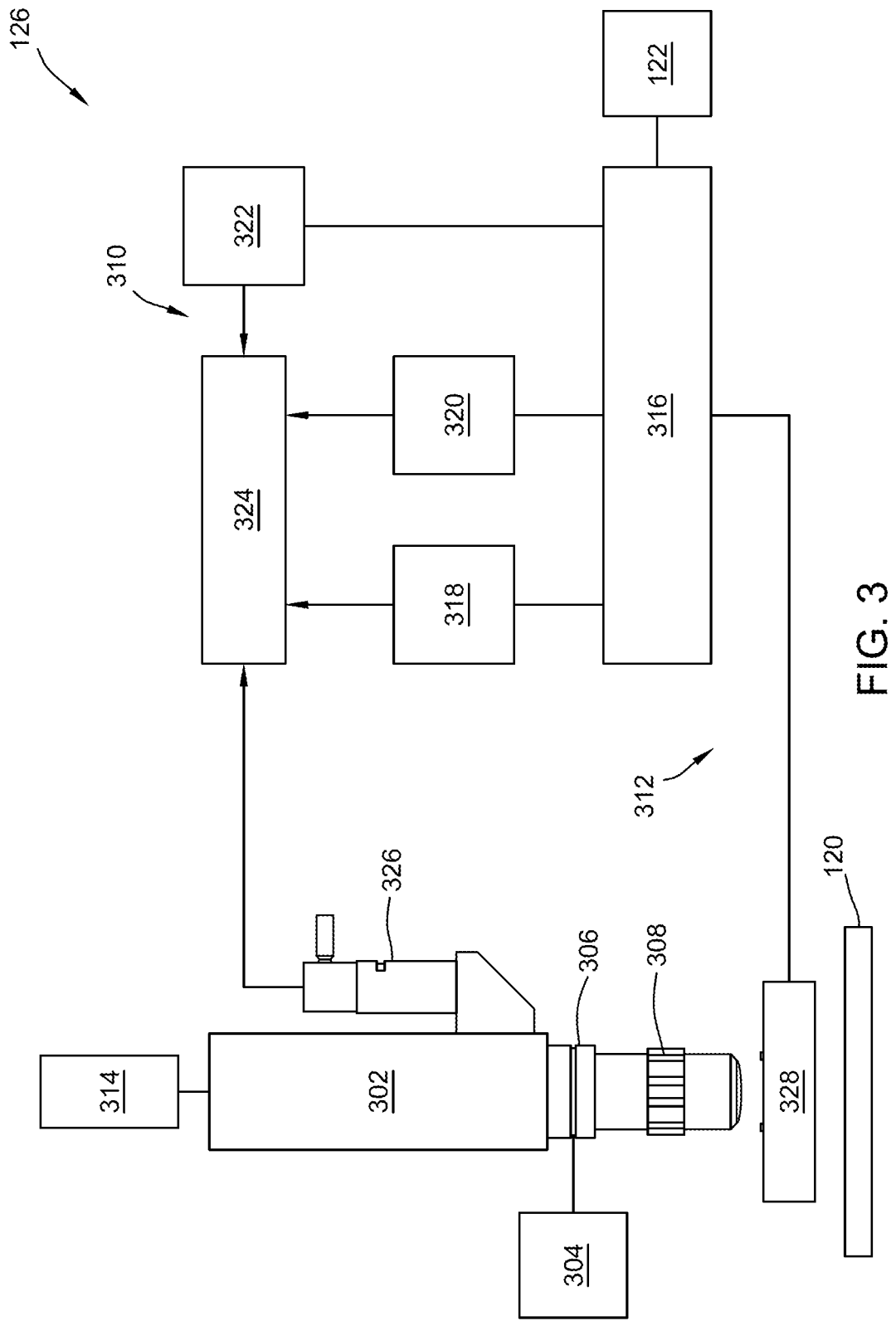
FIG. 3 illustrates a schematic view of a metrology system in accordance with at least one implementation of the present disclosure.

FIG. 3 illustrates a schematic view of the metrology system 126 in accordance with at least one implementation of the present disclosure. The metrology system 126 may be positioned on the support 108 and/or the support 208 in order to capture images and measurement data on the substrate 120. The metrology system 126 is electrically connected to the controller 122. The controller 122 is generally designed to facilitate the control and automation of the metrology and processing techniques described. For example, the controller 122 provide instructions to the metrology system 126 to capture images. The controllers 122 also receive and send data acquired by the metrology system 126. The metrology system 126 also adjusts focus, as instructed by the controllers 122. The controllers 122 further enable the metrology system to communicate with the IPSs 210 and share data therebetween. For example, positon data can be shared between the IPSs 210 and the metrology system 126 to improve alignment resolution. The metrology system 126 includes a microscope body 302, a piezoelectric motor 304, a focusing stage 306, an objective lens 308, bright field illumination system 310, a dark field illumination system 312, and a camera 314. The microscope body 302 includes an input arm 326. The input arm 326 is coupled to the bright field illumination system 310. The microscope body 302 is positioned towards the substrate 120 sitting on the stage 114 (see FIG. 1 and FIG. 2).

The camera 314 is electrically connected to the microscope body 302. The camera 314 captures images of the substrate 120. The images are provided to the controller 122. The camera 314 captures images at multiple different focuses. The objective lens 308 is coupled to a focusing stage 306. The objective lens 308 is the optical element that gathers light from the object being observed and focuses the light rays to produce a real image. The objective lens 308 includes a magnification that ranges between about 4 times and about 100 times the object being observed.

The focusing stage 306 is disposed between the microscope body 302 and the objective lens 308. The focusing stage 306 is configured to move in a vertical direction (defined as normal to the surface of the substrate 120 to be measured) such that the objective lens 308 also moves in a substantially vertical direction. The focusing stage 306 is coupled to the piezoelectric motor 304. The piezoelectric motor 304 provides power to the focusing stage 306 to move the objective lens 308. The controller 122 instructs the piezoelectric motor 304 when to provide power to the focusing stage 306. In operation, the objective lens 308 moves in a substantially vertical direction to capture images of the substrate 120. The focus of the objective lens changes depending on the vertical position. The camera 314 captures images of the substrate 120 at each vertical position with a different focus.

The bright field illumination system 310 includes an illumination controller 316, a first LED 318, a second LED 320, a third LED 322, and a light delivery module 324. The bright field illumination yields dark objects on a bright background, where the bright background is created with the LEDs. The bright field illumination system 310 provides bright field light to the input arm 326. The bright field light from the LEDs (first LED 318, second LED 320, and the third LED 322) is directed through the microscope body 302 to illuminate the substrate 120. The first LED 318, the second LED 320, and the third LED 322 are connected to the light delivery module 324. The light delivery module 324 includes one or more dichroic mirrors therein to deliver light from the one or more of the first LED 318, the second LED 320, and the third LED 322 to the input arm 326. The bright field light may be delivered to the input arm 326 from the light delivery module 324 via a coaxial fiber cable. Each of the first LED 318, the second LED 320, and the third LED 322 are configured to provide a bright field light at different wavelengths. For example, the first LED 318 provides light at a wavelength between about 470 nm to about 530 nm, the second LED 320 provides light at a wavelength between about 365 nm and about 590 nm, and the third LED 322 provides light at a wavelength between about 617 nm and about 850 nm. In some implementations, light from the LEDs can be combined in the light delivery module 324 to adjust the wavelength of the light delivered to the input arm 326. As different substrates behave differently, providing different wavelengths to the substrates improves visibility of the substrates to be measured. The illumination controller 316, in communication with the controller 122, instructs the first LED 318, the second LED 320, and the third LED 322 to provide light to the input arm 326 to improve visibility of the substrate 120. Therefore, the bright field illumination system 310 is configured to provide multi-color illumination to the substrate 120, and is controlled by the illumination controller 316.

The dark field illumination system 312 includes a dark field illuminator 328 and the illumination controller 316. The dark field illuminator 328 is a light ring with a plurality of LEDs disposed thereon. The dark field illumination system 312 is positioned between the objective lens 308 and the substrate 120. In some implementations, which can be combined with other implementations described, the LEDs are positioned at an angle relative to the surface of the substrate 120 to be measured. The illumination controller 316 is electrically connected to the dark field illuminator 328. The illumination controller 316, in communication with the controller 122, instructs the dark field illuminator 328 to provide light to improve visibility of the substrate 120. The dark field illumination yields a dark background around the substrate 120 to improve visibility and to highlight any surface defects.

In operation, the metrology system 126 is positioned above a substrate 120 to be measured. The dark field illumination system 312 and the bright field illumination system 310 illuminate the substrate 120. The objective lens 308 is moved in a substantially vertical direction by the focusing stage 306 while the camera 314 captures images at each different focus. The images are provided to the controller 122 for facilitation.

Figure 4A:
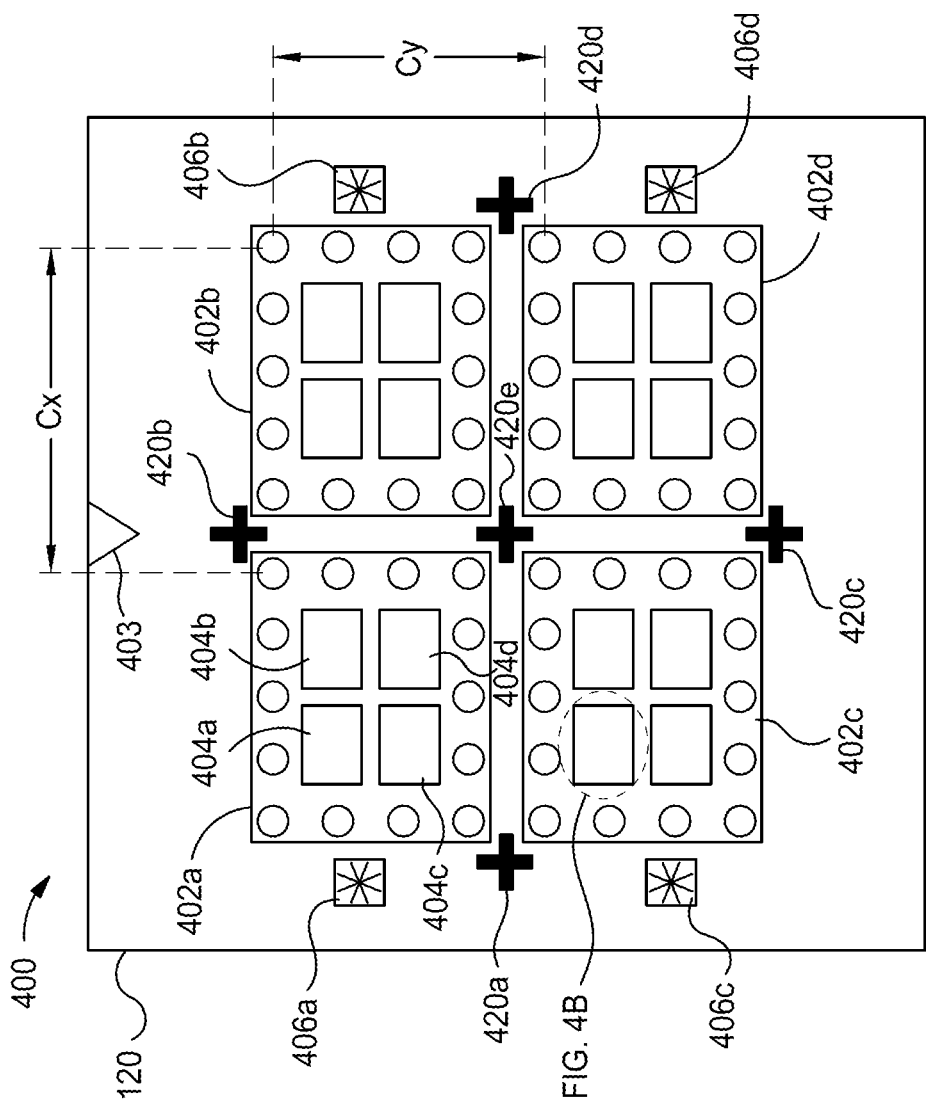
FIG. 4A illustrates a top schematic view of a substrate in accordance with at least one implementation of the present disclosure.
Figure 4B:
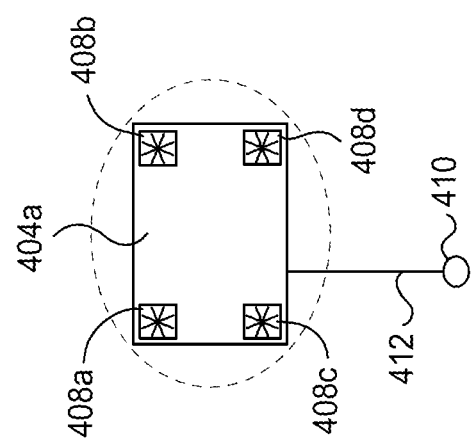
FIG. 4B illustrates an enlarged top schematic view of a portion of FIG. 4A in accordance with at least one implementation of the present disclosure.

FIG. 4A illustrates a top schematic view of a substrate, for example, the substrate 120, in accordance with at least one implementation of the present disclosure. FIG. 4B illustrates an enlarged top schematic view of a portion of the substrate shown in FIG. 4A in accordance with at least one implementation of the present disclosure. The substrate 120 includes a substrate layout design 400, according to certain implementations. In this context, the substrate layout design 400 may be a layout of design elements to be patterned on the substrate 120, developed by a designer, programmatically, or a combination of both. The substrate layout design 400 may include more than one layer, for patterning on the substrate 120. Multiple layers may be patterned to form computer processing units, graphics processing units, and the like. The substrate layout design 400 is provided to the digital lithography system 200 for patterning on the substrate 120, and includes a variety of features, limited only by the design required to meet one or more customer requirements. Such features may include connection lines, logic, transistors, and vias from other layers. Turning to FIG. 4B, the features may have a design connection point 410 and according to certain implementations may be positioned to be connected via pixel model 412 to another design connection point on the substrate 120, or to one or more packages 402a-d (collectively 402). Although shown as points in FIG. 4B, the design connection point 410 may include both a point, and a line extending from the point.

Referring to FIG. 4A, the substrate 120 includes the one or more packages 402a-d formed on the substrate 120. Each package 402 includes collections of one or more die 404a-d (collectively 404). The number of packages 402 is not limited by FIG. 4. The number of die 404 is not limited by FIG. 4A. The die 404 may be pre-assembled/fabricated elements that may be placed on the substrate 120 during manufacturing and in some implementations may be fabricated separately on the substrate 120. According to certain implementations, the die 404 may include functional elements that provide functionality as part of the substrate layout design 400, and may include functional elements such as memories, processors, application specific logic, lens arrays, active quantum dots, color filters, light focusing sidewall mirrors, and other components for additional functionality.

The substrate 120 includes one or more global alignment marks 406a-d (collectively 406) or global marks. The global alignment marks 406 may be patterned by one or more IPSs 210, and positioned to be measured by one or more IPSs and/or the metrology systems 126. The global alignment marks 406 have known positions in a lithography coordinate system of stage 114, to which substrate 120 is attached. For example, in some implementations, the measured position of the global alignment marks 406 is in terms of a coordinate system of the stage 114, or one readily transformable into stage coordinates, for example, a substrate or metrology coordinate system. The design position of the global alignment marks 406 is in the GDS file and the OTM uses the actual measured position of the global alignment marks 406 to transfer the metrology data into the lithography coordinate system. Collecting data of the positions of the global alignment marks 406 enables alignment resolution. For example, overlay alignment between multiple layers on the substrate 120 is achieved via the global alignment marks 406. The global alignment marks 406 may have a width in a range from about 50 microns to about 1000 microns, or in a range from about 50 microns to about 500 microns, or in a range from about 100 microns to about 500 microns. Although four global alignment marks 406 are shown in FIG. 4A any suitable number of alignment marks sufficient for enabling alignment resolution may be used.

Additionally, referring to FIG. 4B, each die 404 may include a die mark 408a-d (collectively 408). In at least one implementation, the die marks 408 are on the packages 402. The die marks 408 are patterned by one or more IPSs 210, and positioned to be measured by one or more IPSs and/or the metrology systems 126. The die marks 408 have known positions in the lithography coordinate system of the stage 114, to which substrate 120 is attached. The die marks 408 are utilized to indicate placement for digital correction printing. For example, shifting of the die 404 and rotation of the die 404 can be addressed with positon data of the die marks 408. The die marks 408 may have a width in a range from about 20 microns to about 250 microns, or in a range from about 20 microns to about 50 microns, or in a range from about 20 microns to about 40 microns. In at least one implementation, the die marks 408 have a width of about 50 microns or less. Although four die marks 408a-d are shown on the die 404a in FIG. 4A any suitable number of die marks be used. In at least one implementation, each of the four die marks 408a-d are positioned in a respective corner of the die 404a.

Further, referring to FIG. 4A, the substrate 120 may include one or more mini-marks 420a-e (collectively 420). The mini-marks 420 may be patterned by one or more IPSs 210, and positioned to be measured by one or more IPSs and/or the metrology systems 126. In at least one implementation, the mini-marks 420 are formed on the surface of the substrate 120. The mini-marks 420 may have known positions in the coordinate system of stage 114, to which substrate 120 is attached. Collecting data of the positions of the mini-marks 420 enables additional alignment resolution. For example, overlay alignment between multiple layers can be achieved via the mini-marks 420. The mini-marks 420 may have a width in a range from about 50 microns to about 1000 microns, or in a range from about 50 microns to about 500 microns, or in a range from about 100 microns to about 500 microns. Although five mini-marks 420 are shown in FIG. 4A any suitable number of mini-marks 420 sufficient for enabling alignment resolution may be used. The mini-marks 420 are generally distinguishable from the global alignment marks 406 in size, shape, or both size and shape. For example, as shown in FIG. 4A, the mini-marks 420 have a cross-shape and the global alignment marks 406 have a star-shape. In at least one implementation, the mini-marks 420a-e are positioned in between adjacent packages 402a-d. For example, as shown in FIG. 4A, the mini-mark 420e is positioned at the intersection of the packages 402a-d, a portion of the mini-mark 420a is positioned in between the package 402a and the package 402c, a portion of the mini-mark 420b is positioned in between the package 402a and the package 402b, a portion of the mini-mark 420d is positioned in between the package 402b and the package 402d, and a portion of the mini-mark is positioned in between the package 402d and the package 402c.

In at least one implementation, the global alignment marks 406 may be used for alignment of the one or more metrology systems 126 with the substrate 120.

In at least one implementation, the substrate 120 further includes one or more calibration marks 403 or notches. The calibration marks 403 may be used for coarse alignment of the one or more metrology systems 126, the IPSs 210, or both the metrology systems 126 and the IPSs 210 with the substrate 120.

The metrology systems 126 are configured to measure the die marks 408 despite the smaller width. Although the global alignment marks 406, the die marks 408, and the mini-marks 420 are shown in FIGS. 4A-B to have specific shapes, the global alignment marks 406, the die marks 408, and the mini-marks 420 are not limited in shape as long as each type of mark is distinguishable from other types of marks. For example, any of the global alignment marks 406, the die marks 408, and the mini-marks 420 may have a circular, square, rectangular, cross, triangular, or other suitable shape. As the width of the marks decrease in size, the metrology systems 126 allow for imaging of each type of mark.

Figure 5:
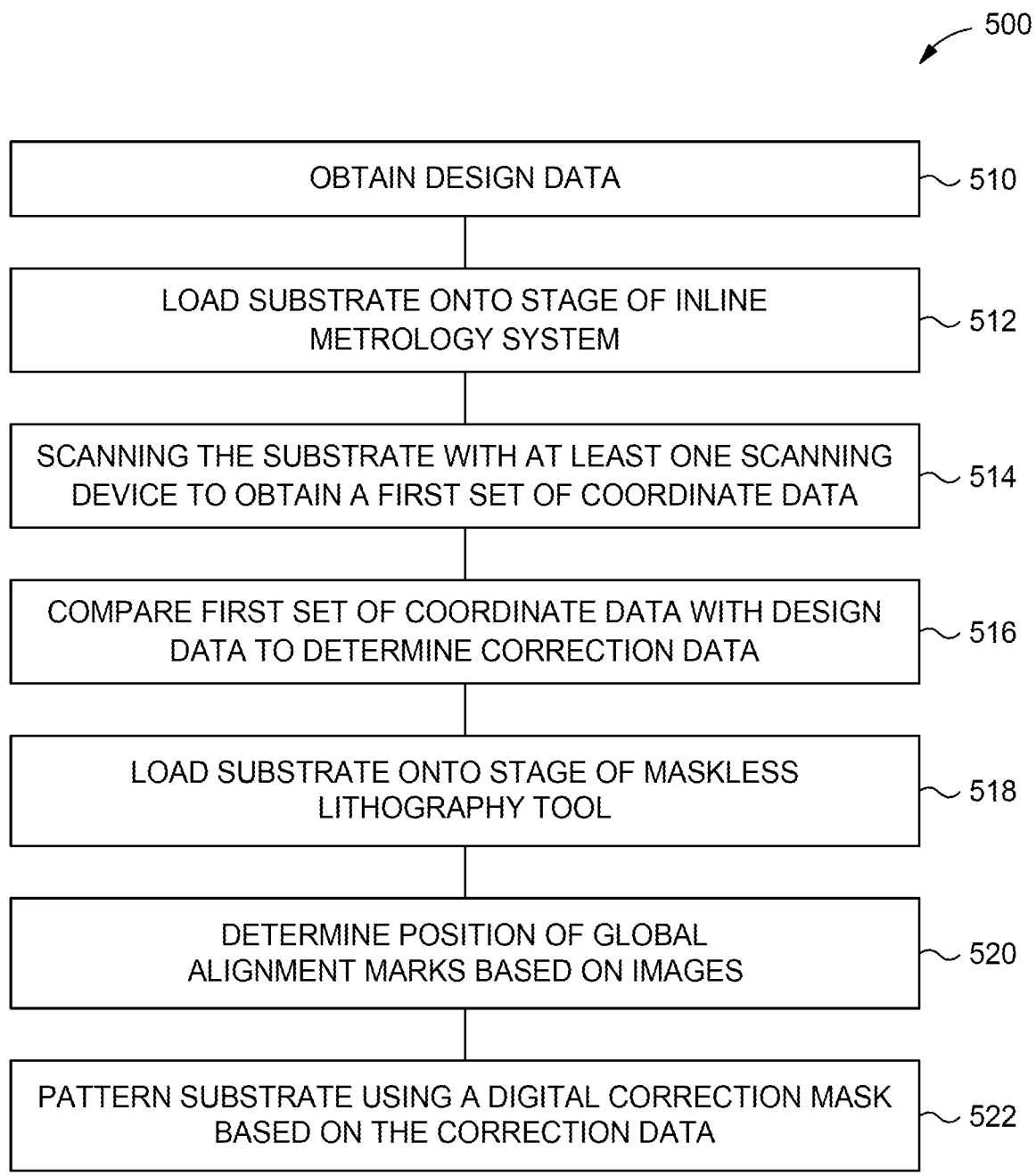
FIG. 5 illustrates a flow diagram of a method for packaging alignment and corrections in accordance with at least one implementation of the present disclosure.

FIG. 5 illustrates a flow diagram of a method 500 for packaging alignment and corrections in accordance with at least one implementation of the present disclosure. The method 500 utilizes an inline metrology system (IMS), for example, the inline metrology system 100, in combination with a digital lithography system having on tool metrology (OTM), for example, the digital lithography system 200, to enable substrate overlay alignment and die placement correction. The method 500 determines correction data to provide overlay alignment accuracy and digital die correction using the IMS to be used during subsequent patterning processes performed on the digital lithography system 200. The correction data will improve yield of semiconductor devices due to less variance from a design file. To facilitate explanation, the method 500 is described with reference to FIGS. 1-4B. Although the method 500 is described with reference to the inline metrology system 100 and the digital lithography system 200, the method 500 may be performed using other metrology and digital lithography systems. In addition, although the method 500 is described with reference to the substrate 120, the method 500 may be performed on other types of substrate, for example, semiconductor wafers.

At operation 510, design data may be obtained. In at least one implementation, the design data includes a layout design, for example, the substrate layout design 400 depicted in FIGS. 4A and 4B, of design elements to be patterned on the substrate 120. The layout design can be developed by a designer, programmatically, from manufacturing drawings, or a combination thereof. The layout design can include general location information. This general location information can include coordinate data on a component as well as a connection pattern to the component in a designed state. The data may include, design positions, for example, the location of reference marks, such as calibration marks, die marks, global alignment marks, mini-marks, etc. The data may include the nominal or design location of the die marks relative to the location of the global alignment marks. The data may include the nominal or design location of the die marks relative to a metrology coordinate system of the substrate established by the global alignment marks. The layout design can be stored in graphic data system files (e.g., "GDS"). However, the file can be any format, which provides graphic data.

At operation 512, a substrate is loaded into an inline metrology system. For example, the substrate 120 is loaded onto the stage 114 of the inline metrology system 100. In at least one implementation, the stage 114 includes additional marks (not shown) for alignment of the stage 114 with the one or more metrology systems 126. The substrate 120 includes the one or more packages 402, which each include the one or more die 404a-d. For illustrative purposes only, the substrate 120 includes the one or more calibration marks 403, the global alignment marks 406a-d, and the mini-marks 420a-e on the substrate 120 and die marks 408a-d on the one or more die 404a-d. The calibration mark 403 may be used for coarse alignment of the one or more metrology systems 126 with the substrate 120. The global alignment marks 406 are disposed on the substrate 120 to establish a metrology coordinate system of the entire substrate 120. The metrology coordinate system may be an X-Y coordinate system. The die marks 408a-d are disposed on the one or more die 404a-d to establish where the die 404a-d are positioned on the substrate 120. For example, the die marks 408a-d are utilized to determine shifting and rotation of the die 404a-d relative to the global alignment marks 406, relative to the metrology coordinate system established by the global alignment marks 406, or relative to both the global alignment marks 406 and the metrology coordinate system. Further, the die marks 408a-d are utilized for digital die correction.

Digital die correction allows for correction of the placement of the design connection points 410 and pixel models 412 in subsequent layers patterned on the substrate 120.

At operation 514, the substrate is scanned with at least one scanning device of the inline metrology system to obtain a first set of coordinate data. For example, the substrate 120 is scanned with one or more of the metrology systems 126 of the inline metrology system 100 to obtain the first set of coordinate data. The first set of coordinate data may include the actual location of reference marks, for example, the one or more global alignment marks 406, the one or more die marks 408, the one or more mini-marks 420, the Z-height of the reference marks or substrate, or any combination thereof.

In operation, the metrology systems 126 of the inline metrology system 100 may be aligned with the global alignment marks 406 on the substrate 120. As the substrate 120 and the stage 114 advance along the tracks 116 in the x-direction, the substrate 120 and the stage 114 both eventually pass under the one or more metrology systems 126. As the substrate 120 passes under the one or more metrology systems 126, images of any of the one or more reference marks may be simultaneously or sequentially captured by the one or more metrology systems 126.

For illustrative purposes only, capturing images and actual locations of the reference marks for example, the one or more global alignment marks 406, the one or more die marks 408, the one or more mini-marks 420, the Z-height of the reference marks or substrate, or any combination thereof is described as occurring simultaneously. However, there is no temporal limitation on whether the capturing of images and locations of each of the reference marks occurs simultaneously with the other reference marks. For example, capturing images and locations of the one or more global alignment marks 406 may occur prior to capturing images of the one or more die marks 408.

Referring to FIG. 3, in at least one implementation, during operation 514, the objective lens 308 of one or more of the metrology systems 126 is moved in a substantially vertical direction by the focusing stage 306 and the bright field illumination system 310 provides bright field light to the input arm 326. The objective lens 308 is moved substantially vertically via the focusing stage 306 to adjust the focus of the objective lens 308. The bright field light from the LEDs (first LED 318, second LED 320, and the third LED 322) is directed through the microscope body 302 to illuminate the substrate 120. The illumination controller 316, in communication with the controller 122, instructs the dark field illuminator 328 to provide light to improve visibility of the substrate 120. The dark field illumination yields a dark background around the substrate 120 to improve visibility and to highlight any surface defects.

The one or more metrology systems 126 capture multiple images of at least one of the global alignment marks 406, the die marks 408a-d, and the mini-marks 420a-e. The camera 314, which is in communication with the objective lens 308, captures the images at the different focuses. Due to the objective lens 308, the camera 314 can capture the global alignment marks 406 and the die marks 408a-d. The images are sent to the controller 122. An image processing algorithm executed by the controller 122 determines which image is in focus. In one example, the image processing algorithm is an image based auto-focusing algorithm such as global search of contrast vs focus position of the piezo or phase detection. In at least one implementation, autofocus data based on process history from the IPSs 210 of the digital lithography system 200 is obtained from the IPSs 210. The autofocus data is utilized with the image processing algorithm to predict which image is in focus. In other implementations, which can be combined with other implementations described, the image processing algorithm is calibrated with the autofocus data.

After the substrate is scanned with at least one scanning device of the inline metrology system to obtain a first set of coordinate data at operation 514, the substrate may be removed from the inline metrology system 100.

The images of the global alignment marks 406 captured during operation 514 ensure overlay alignment accuracy. The location of the global alignment marks 406 may be used to establish the general location information of the substrate 120. For example, the location of the global alignment marks 406 defines a metrology coordinate system of the substrate 120. The images of the die marks 408 are captured to analyze die shift and rotation of the die 404. For example, the actual location of the die marks 408 relative to the general location information, the global alignment marks 406, or both the general location information and the global alignment marks 406 is determined using the captured images.

Positions of the global alignment marks 406, the die marks 408, and optionally the mini-marks 420 are determined based on the images. The positons of the global alignment marks 406, the die marks 408, and the mini-marks 420 are determined from the in focus images. The mark positions may be detected using algorithms such as template-based detection and feature based detection. The position of the global alignment marks 406, the die marks 408, and optionally the mini-marks 420 are determined relative to the metrology coordinate system. As such, the position of the global alignment marks 406, the die marks 408, and the mini-marks 420 on the metrology coordinate system are determined. In at least one implementation, the metrology coordinate system is calibrated with a lithography coordinate system. The lithography coordinate system is the coordinate system mapped on the substrate 120 relative to the IPSs 210 of the digital lithography system 200 during subsequent patterning processes. By transferring the metrology coordinate system to the IPSs 210, subsequent patterning steps will be able to digitally correct any placement errors of the die 404.

At operation 516, the first set of coordinate data, which contains the actual location of the reference marks, is compared with the design data, which contains the design location of the reference marks to determine correction data. The actual positions of the global alignment marks 406, the die marks 408, and optionally the mini-marks 420 are obtained during operation 514. The actual position data is sent to the controller 122 for further processing. The actual positions of the global alignment marks 406, the die marks 408, and optionally the mini-marks are compared with a design file (e.g., GDS file) for example, the design file obtained during operation 510. The design file includes design positions of the global alignment marks 406, the die marks 408, and optionally the mini-marks 420. The difference between the design positions and actual positions are compared. For example, the actual location of the die marks 408 relative to the global alignment marks 406, the metrology coordinate system, or both the global alignment marks 406 and the metrology coordinate system are compared with the design location of the die marks 408 relative to the global alignment marks 406, the metrology coordinate system, or both the global alignment marks 406 and the metrology coordinate system to determine a difference. Based on the difference, the controller 122 determines correction data. The correction data allows for compensation for the differences between the design positions and actual positions such that subsequent patterns will be aligned with the design file.

The correction data provides updated positions of the design connection points 410 between die 404 to be formed in subsequent patterning operations. Further, the difference between the design positions and actual positions will allow for overlay alignment accuracy when patterning subsequent layers. The difference between the design positions and actual positions allows for digital correction printing to correct die placement errors. In-situ verification of process stability is also verifiable based on the difference between design positions and actual positions. The location of the global alignment marks 406, the die marks 408, the minimarks 420, and the correction data may be stored in memory, for example, in a Universal Metrology File (UMF) file, which may also contain substrate identification.

At operation 518, the substrate is loaded into a digital lithography system. For example, the substrate 120 is loaded onto the stage 114 of the digital lithography system 200. In at least one implementation, the stage 114 includes reference marks (not shown) for alignment of the stage 114 with the one or more metrology systems 126 and/or the IPSs 210 of the digital lithography system 200. The one or more metrology systems 126 and/or the IPSs 210 of the digital lithography system 200 may be aligned with the substrate 120 using the one or more calibration marks 403.

At operation 520, the substrate is scanned with at least one scanning device of the digital lithography system 200 to determine the actual location of the global alignment marks 406 in order to confirm the orientation of the substrate. For example, the substrate 120 is scanned with one or more of the metrology systems 126, the IPSs 210, or both the metrology systems 126 and the IPSs 210 of the digital lithography system 200 of the inline metrology system 100 to capture images of the actual location of the global alignment marks 406. The images and actual location of the global alignment marks 406 may be determined as described in operation 514. Since the substrate 120 may shift during transfer from the inline metrology system 100 to the digital lithography system 200, determining the location of the global alignment marks 406 during operation 520 reestablishes the general location information of the substrate 120. For example, the position of the global alignment marks 406 reestablishes the location of the metrology coordinate system. The metrology coordinate system is calibrated with the lithography coordinate system, which is the coordinate system mapped on the substrate 120 relative to the IPSs 210 of the digital lithography system 200 during the subsequent patterning process of operation 522. By reestablishing the metrology coordinate system and transferring the substrate coordinate system to the IPSs 210, subsequent patterning steps will be able to digitally correct any placement errors of the die 404.

At operation 522, the digital lithography system 200 patterns the substrate 120 using a digital correction mask based on at least the correction data obtained during operation 516. The IPSs 210 pattern the substrate 120 according to the adjustments determined in operation 516 to better align with the design file. The controller 122 is provided updated instructions for patterning. As such, the overlayed layers are aligned and the design connection points 410 between die 404 are located according to the design file. After processing at operation 522, the substrate 120 is removed from the digital lithography system 200.

In at least one implementation, the global alignment and focusing data from the on tool metrology system, for example, the metrology systems 126 obtained during operation 520 can feedback to the inline metrology system 100. This feedback of global alignment data from the digital lithography system 200 to the inline metrology system 100 can enable improved metrology capture performance. For example, the feedback data from the digital lithography system 200 can be used to optimize focusing performance of the inline metrology system 100 when obtaining metrology data from subsequently processed substrates, which can reduce the time for capturing metrology data from the subsequently processed substrates.

Figure 6A:
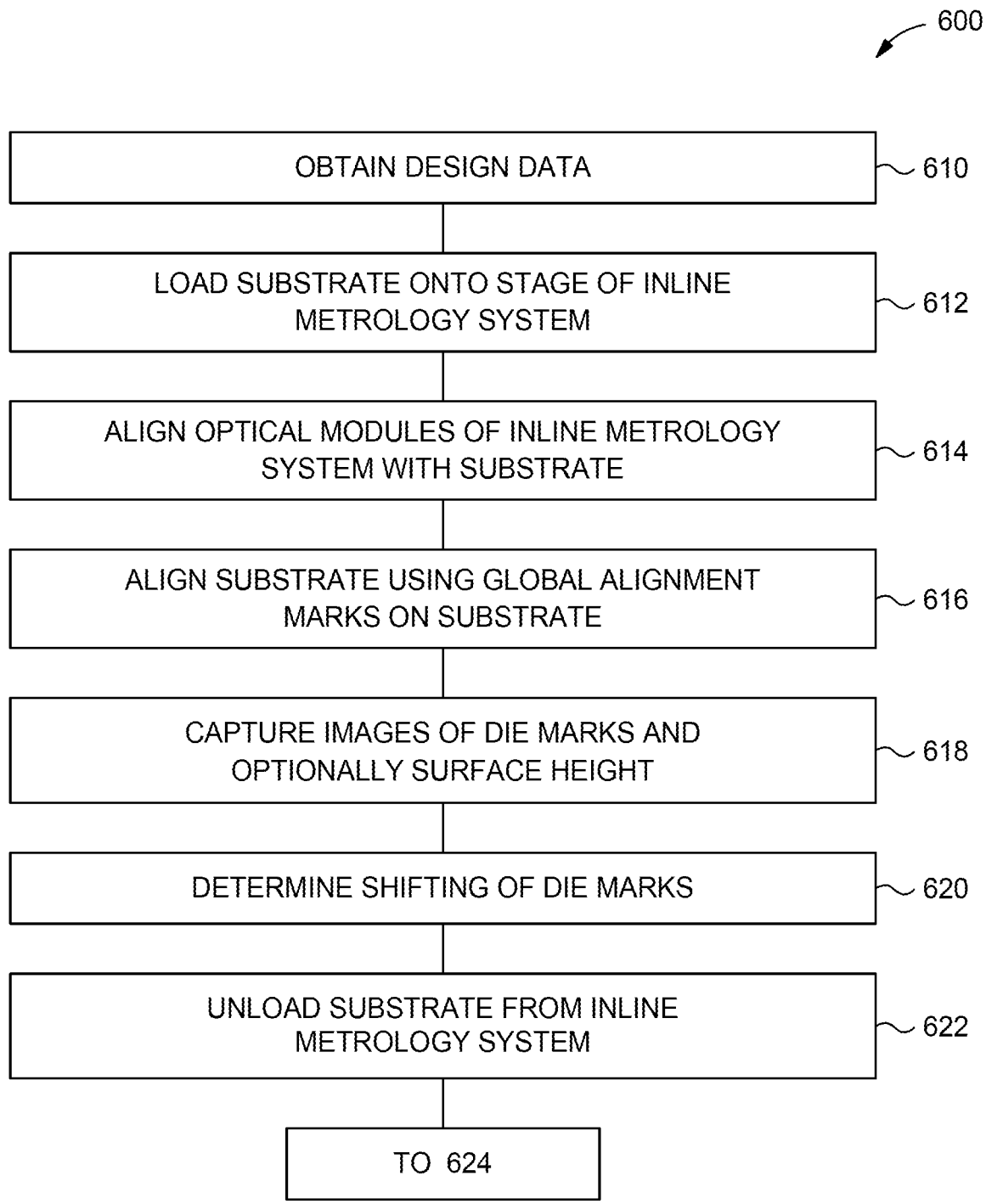
FIGS. 6A-6B illustrates another flow diagram of a method for packaging alignment and corrections in accordance with at least one implementation of the present disclosure.
Figure 6B:
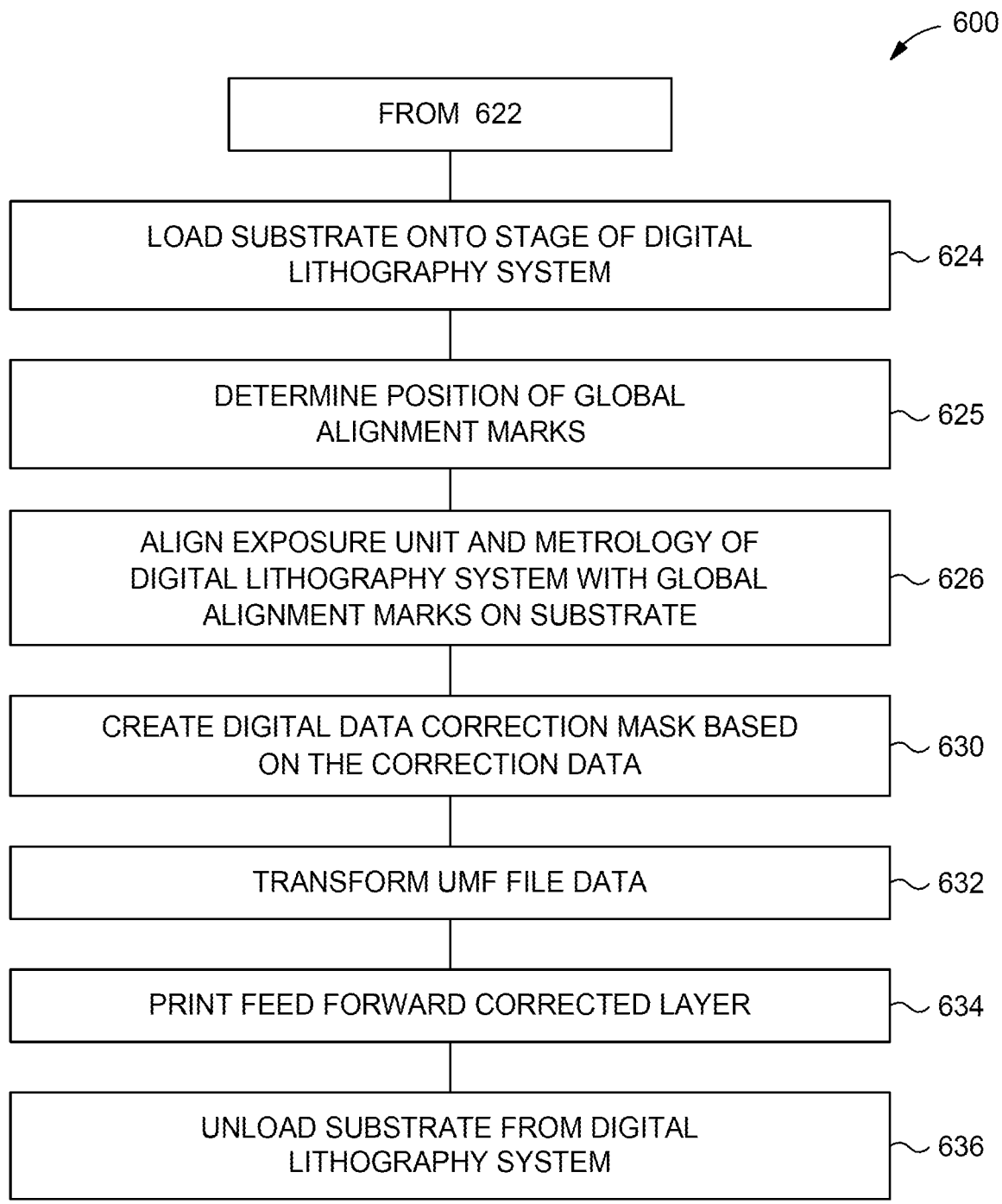

FIGS. 6A-6B illustrate a flow diagram of another method 600 for packaging alignment and corrections in accordance with at least one implementation of the present disclosure. The method 600 also utilizes an inline metrology system (IMS), for example, the inline metrology system 100, in combination with a digital lithography system having on tool metrology (OTM), for example, the digital lithography system 200, to enable substrate overlay alignment and die placement correction. The method 600 also determines correction data to provide overlay alignment accuracy and digital die correction using the IMS to be used during subsequent patterning processes performed on the digital lithography system 200. The correction data improves yield of semiconductor devices due to less variance from a design file. To facilitate explanation, the method 600 is described with reference to FIGS. 1-4B.

At operation 610, design data may be obtained, such as a layout design, for example, the substrate layout design 400 depicted in FIG. 4A and FIG. 4B, of design elements to be patterned on the substrate 120 as described in operation 510.

At operation 612, a substrate is loaded onto a stage of an inline metrology system. For example, the substrate 120 is loaded onto the stage 114 of the inline metrology system 100 as described in operation 512.

At operation 614, optical modules of the inline metrology system are aligned with the substrate. For example, the one or more metrology systems 126 on the inline metrology system 100 are aligned with the global alignment marks 406 or other marks, for example, the calibration marks 403 formed on the substrate 120.

At operation 616, images of global alignment marks formed on the substrate are captured. For example, images of the global alignment marks 406 formed on the substrate 120 are captured. The global alignment marks 406 define a metrology coordinate system of the substrate 120. The images of the global alignment marks 406 may also be used to ensure overlay alignment accuracy. Images of the global alignment marks 406 may be captured as described in operation 514. In at least one implementation, the metrology coordinate system is calibrated with a lithography coordinate system. The lithography coordinate system is the coordinate system mapped on the substrate 120 relative to the IPSs 210 of the digital lithography system 200 during subsequent patterning processes. By transferring the metrology coordinate system to the IPSs 210, subsequent patterning steps performed in the digital lithography system 200 will be able to digitally correct any placement errors of the die 404.

At operation 618, images of die marks formed on one or more die 408a-d formed on the substrate are captured. For example, images of the die marks 408a-d formed on the substrate 120 are captured. In at least one implementation, the surface height of the die marks 408a-d is also determined from the images.

At operation 620, shifting of the die marks is determined. An actual position of the die marks is determined based on the images captured during operation 618. The position of the die marks 408*a-d* may be determined relative to the metrology coordinate system established by the global alignment marks 406. The actual position of the die marks 408*a-d* is compared with the design position of the die marks 408*a-d* to determine the shifting of the die marks 408*a-d*. The design position of the die marks 408*a-d* may be determined from the design data obtained during operation 610. The die mark shift may be used to determine correction data. The information obtained about from the die marks, for example, an X-shift value of the die, a Y-shift value of the die, rotation value of the die, scaling of the die, Z-height of the die, and/or the correction data may be stored in memory, for example, in a Universal Metrology File (UMF) file, which may also contain substrate identification information. Based on the difference, the controller 122 determines correction data. The correction data allows for compensation for the differences between the design positions of the die 402*a-d* and the actual positions of the die 402*a-d* such that subsequent patterns will be aligned with the design file.

At operation 622, the substrate may be unloaded from the inline metrology system. For example, the substrate 120 is unloaded from the inline metrology system 100. The substrate 120 may then be subjected to material handling. The orientation of the substrate 120 may shift during material handling.

At operation 624, the substrate is loaded onto a stage of a digital lithography system. For example, the substrate 120 is loaded onto the stage 114 of the digital lithography system 200 as described in operation 518.

At operation 625, the actual location of the global alignment marks is determined in order to confirm the orientation of the substrate. For example, the actual location of the global alignment marks 406 is determined as described in operation 520.

At operation 626, an exposure unit and on tool metrology of the digital lithography system are aligned with the substrate. For example, the IPSs 210 and the metrology systems 126 of the digital lithography system 200 are aligned with the substrate 120 using the global alignment marks 406 or other marks, for example, the calibration marks 403 formed on the substrate 120. The global alignment marks 406 define the metrology coordinate system of the substrate 120. In at least one implementation, images of the global alignment marks 406 on the substrate 120 are captured to confirm orientation of the substrate 120. During transfer of the substrate from the inline metrology system 100 to the digital lithography system 200, the orientation of the substrate 120 may change. For example, the substrate 120 may shift or rotate during transfer and placement on the stage 114 of the digital lithography system 200. Images of the global alignment marks 406 may be captured using the metrology systems 126 of the digital lithography systems 200.

At operation 630, a digital correction mask layout is created using measured die locations. For example, a digital correction mask is created using the measured die locations from operation 620.

At operation 632, the UMF file data with the measured data from the inline metrology system is transformed to the lithography coordinate systems established by the global alignment marks at operation 626.

At operation 634, the digital lithography system 200 patterns the substrate 120 using a digital correction mask based on at least the correction data obtained by the inline metrology system 100. The IPSs 210 pattern the substrate 120 according to the adjustments determined in operation 620 to better align with the design file. The controller 122 is provided updated instructions for patterning. As such, the overlayed layers are aligned and the design connection points 410 between die 404 are located according to the design file.

After processing at operation 636, the substrate 120 is removed from the digital lithography system 200 and may be subject to additional processing.

Figure 7:
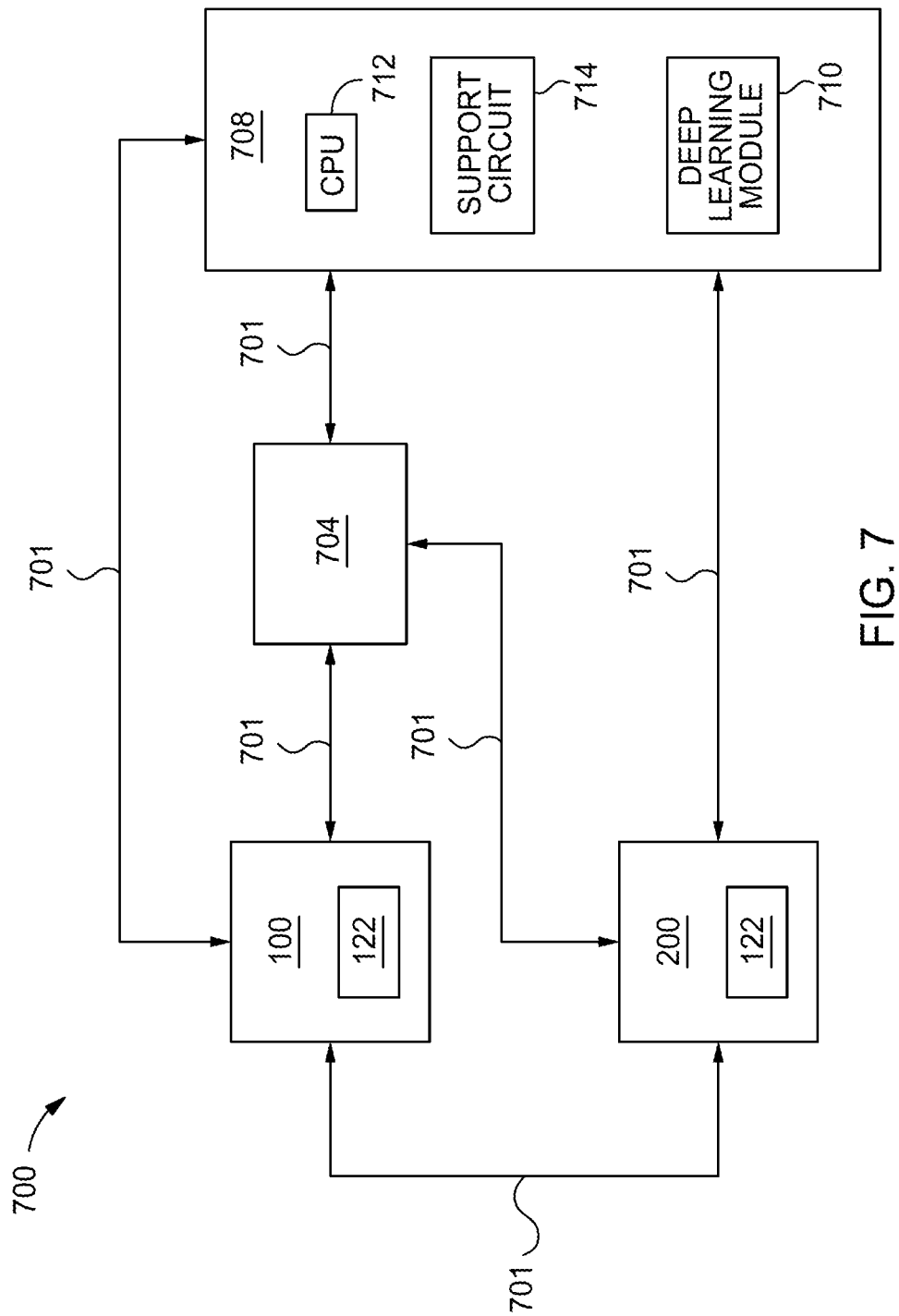
FIG. 7 illustrates a schematic view of a digital lithography environment in accordance with at least one implementation of the present disclosure.

FIG. 7 illustrates a schematic view of a digital lithography environment 700 in accordance with at least one implementation of the present disclosure. As shown, the digital lithography environment 700 includes, but is not limited to, the inline metrology system 100, a data storage device 704, the digital lithography system 200, a server 708, and communication links 701. Additional lithography environment devices, for example, the inline metrology system 100, the data storage device 704, the digital lithography system 200, and the server 708, may be included in the digital lithography environment 700. Each of the lithography environment devices is operable to be connected to each other via the communication links 701. Each of the lithography environment devices is operable to be connected to the server 708 by the communication links 701. Alternatively or additionally, each of the lithography environment devices can communicate indirectly by first communicating with the server 708, followed by the server 708 communicating with the lithography environment device in question. The digital lithography environment 700 can be located in the same area or production facility, or the each of the lithography environment devices can be located in different areas.

Each of the plurality of lithography environment devices are additionally indexed with at least one of the method 500 and the method 600, described. Each of the inline metrology system 100, the data storage device 704, the digital lithography system 200, and the server 708 may include an on-board processor and memory, where the memory is configured to store instructions corresponding to any portion of the method 500 and the method 600. The communication links 701 may include at least one of wired connections, wireless connections, satellite connections, and the like. The communications links 701 include sending and receiving a universal metrology file (UMF) or any other file used to store data, according to implementations further described. The communications links 701 can include temporarily or permanently storing files or data in the cloud, before transferring or copying the files or data to the digital lithography system 200.

The server 708 includes a central processing unit (CPU) 712, support circuits 714 and optionally a deep learning (DL) module 710. The CPU 712 can be one of any form of computer processor that can be used in an industrial setting for controlling the lithography environment devices. The DL module 710 is coupled to the CPU 712. The support circuits 714 are coupled to the CPU 712 for supporting the CPU 712 in a conventional manner. These circuits include cache, power supplies, clock circuits, input/output circuitry, subsystems, and the like. The server 708 can include the CPU 712 that is coupled to input/output (I/O) devices found in the support circuits 714 and the DL module 710.

The CPU 712 can be a hardware unit or combination of hardware units capable of executing software applications and processing data. In some configurations, the CPU 712 includes a central processing unit (CPU), a digital signal processor (DSP), an application-specific integrated circuit (ASIC), a graphic processing unit (GPU) and/or a combination of such units. The CPU 712 is generally configured to execute the one or more software applications and process stored media data, which can be each included within the DL module 710. The server 708 controls the transfer of data and files to and from the various lithography environment devices.

In summation, a digital lithography system and methods for alignment resolution with the digital lithography system are provided. The metrology system includes an inline metrology system (IMS) in combination with an on tool metrology system (OTM), which enables improved substrate overlay alignment and die placement correction. The inline metrology system facilitates measurement of high-throughput measurement inline metrology data for package marks, die marks, global alignment marks, and other marks for verification of process stability and die placement data for digital data correction. This high-throughput inline metrology data can be used to prepare a corrected digital mask used for subsequent processing in a digital lithography system. The corrected digital mask provides for improved placement of connections between adjacent die. The OTM provides alignment of the inline metrology data to the digital lithography projection heads of the digital lithography system followed by processing using the corrected digital mask. The IMS and OTM are able to measure smaller alignment marks that the built-in alignment camera of the current digital lithography projection heads cannot measure. The feedback of global alignment and focusing data from the digital lithography tool to the IMS enables improved metrology capture performance.

In the Summary and in the Detailed Description, and the Claims, and in the accompanying drawings, reference is made to particular features (including method operations) of the present disclosure. It is to be understood that the disclosure in this specification includes all possible combinations of such particular features. For example, where a particular feature is disclosed in the context of a particular aspect, implementation, or example of the present disclosure, or a particular claim, that feature can also be used, to the extent possible in combination with and/or in the context of other particular aspects and implementations of the present disclosure, and in the present disclosure generally.

The term "comprises" and grammatical equivalents thereof are used herein to mean that other components, ingredients, operations, etc. are optionally present. For example, an article "comprising" (or "which comprises") components A, B, and C can consist of (i.e., contain only) components A, B, and C, or can contain not only components A, B, and C but also one or more other components. In addition, whenever a composition, an element or a group of elements is preceded with the transitional phrase "comprising" or grammatical equivalents thereof, it is understood that it is contemplated that the same composition or group of elements may be preceded with transitional phrases "consisting essentially of," "consisting of," "selected from the group of consisting of," or "is" preceding the recitation of the composition, element, or elements and vice versa.

Where reference is made herein to a method comprising two or more defined operations, the defined operations can be carried out in any order or simultaneously (except where the context excludes that possibility), and the method can include one or more other operations which are carried out before any of the defined operations, between two of the defined operations, or after all of the defined operations (except where the context excludes that possibility).

When introducing elements of the present disclosure or exemplary aspects or embodiment(s) thereof, the articles "a," "an," "the" and "said" are intended to mean that there are one or more of the elements.

While the foregoing is directed to embodiments of the present disclosure, other and further embodiments of the disclosure may be devised without departing from the basic scope thereof, and the scope thereof is determined by the claims that follow.

The invention claimed is:

1. A method for processing a substrate, comprising:
   loading a substrate onto a stage of an inline metrology tool comprising at least one scanning device, wherein the substrate comprises:
      one or more packages comprising one or more die having die marks formed on the one or more die; and
      one or more global alignment marks formed on the substrate;
   scanning the substrate with the at least one scanning device to obtain a first set of coordinate data, wherein the first set of coordinate data comprises an actual location of the one or more global alignment marks and an actual location of the die marks;
   establishing general location information of the substrate based on the actual location of the one or more global alignment marks;
   determining the actual location of the die marks relative to the general location information;
   comparing the actual location of the die marks relative to the general location information with a design location of the die marks relative to the general location information to determine a correction factor;
   loading the substrate onto a stage of a maskless lithography tool comprising at least one scanning device and at least one image projection system;
   scanning the substrate with the at least one scanning device of the maskless lithography tool to establish the general location information of the substrate based on the actual location of the one or more global alignment marks; and
   patterning subsequent layers onto the substrate using a digital correction mask and the at least one image projection system, wherein the digital correction mask is based, at least in part on the correction factor.

2. The method of claim 1, wherein the one or more global alignment marks have a width in a range from about 50 microns to about 1000 microns.

3. The method of claim 2, wherein the die marks have a width of 50 microns or less.

4. The method of claim 1, wherein establishing the general location information of the substrate, comprises:
   establishing a general coordinate system of the substrate using the actual location of the one or more global alignment marks.

5. The method of claim 4, wherein comparing the actual location of the die marks relative to the general location information with the design location of the die marks relative to the general location information to determine the correction factor comprises comparing the actual location of the die marks relative to the general coordinate system to determine shifting and rotation of the one or more die relative to the general coordinate system.

6. The method of claim 1, wherein the first set of coordinate data further comprises a Z-height of the substrate.

7. The method of claim 1, wherein the first set of coordinate data further comprises the actual location of one or more mini-marks formed on the substrate, wherein the one or more mini-marks are distinguishable from the one or more global alignment marks in size, shape, or both size and shape.

8. The method of claim 7, wherein at least a portion of the one or more mini-marks is positioned between adjacent packages of the one or more packages.

9. The method of claim 1, wherein scanning the substrate with the at least one scanning device to obtain the first set of coordinate data comprises capturing images of the one or more global alignment marks and the die marks.

10. The method of claim 9, wherein capturing images of the one or more global alignment marks and the die marks comprises:
- moving a lens of the at least one scanning device vertically to adjust a focus of the lens on the substrate; and
- providing illumination to the substrate via one or more LEDs and an illuminator, wherein the images are captured at different focuses by moving the lens vertically.

11. A method for processing a substrate, comprising:
- loading a substrate onto a stage of an inline metrology system, wherein the substrate comprises:
  - one or more packages comprising one or more die having die marks formed on the one or more die;
  - global alignment marks formed on the substrate; and
  - one or more calibration marks formed on the substrate;
- capturing images of the global alignment marks using at least one scanning device associated with the inline metrology system to establish a metrology coordinate system of the substrate;
- capturing images of the die marks using the at least one scanning device;
- determining a position of the die marks relative to the metrology coordinate system established by the global alignment marks;
- comparing the position of the global alignment marks and the die marks with a design file to obtain correction data;
- transferring the substrate onto a stage of a digital lithography system;
- determining a position of the global alignment marks using at least one scanning device associated with the digital lithography system to determine positioning of the substrate; and
- patterning subsequent layers onto the substrate using a digital correction mask and at least one image projection system, wherein the digital correction mask is based, at least in part on the correction data.

12. The method of claim 11, wherein the global alignment marks have a width in a range from about 50 microns to about 1000 microns.

13. The method of claim 12, wherein the die marks have a width of 50 microns or less.

14. The method of claim 12, wherein patterning subsequent layers comprises forming connections between adjacent die of the one or more die.

15. The method of claim 11, wherein capturing images of the global alignment marks and capturing images of the die marks comprises:
- moving a lens of the at least one scanning device vertically to adjust a focus of the lens on the substrate; and
- providing illumination to the substrate via one or more LEDs and an illuminator, wherein the images are captured at different focuses by moving the lens vertically.

16. The method of claim 11, further comprising capturing images of one or more mini-marks formed on the substrate using the at least one scanning device, wherein the one or more mini-marks are distinguishable from the global alignment marks in size, shape, or both size and shape.

17. The method of claim 16, wherein at least a portion of the one or more mini-marks is positioned between adjacent packages of the one or more packages.

* * * * *